(12) United States Patent
Chen

(10) Patent No.: US 6,835,575 B2
(45) Date of Patent: Dec. 28, 2004

(54) PASSIVATION LAYER FOR MOLECULAR ELECTRONIC DEVICE FABRICATION

(75) Inventor: Yong Chen, Redwood City, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/402,642

(22) Filed: Mar. 28, 2003

(65) Prior Publication Data
US 2003/0186466 A1 Oct. 2, 2003

Related U.S. Application Data

(62) Division of application No. 09/815,922, filed on Mar. 22, 2001, now Pat. No. 6,707,063.

(51) Int. Cl.[7] .......................... H01L 21/00; H01L 21/20
(52) U.S. Cl. ........................... 438/1; 438/397
(58) Field of Search ........................... 438/1, 397, 398, 438/939; 365/1

(56) References Cited

U.S. PATENT DOCUMENTS

| 4,333,226 A | 6/1982 | Abe et al. |
| 5,272,359 A | * 12/1993 | Nagasubramanian et al. . 257/40 |
| 5,311,039 A | * 5/1994 | Kimura et al. ................. 257/50 |
| 5,350,484 A | 9/1994 | Gardner et al. |
| 5,834,824 A | 11/1998 | Shepherd et al. |
| 6,600,185 B1 | * 7/2003 | Tani et al. ................... 257/296 |

FOREIGN PATENT DOCUMENTS

| DE | 100013013 | 10/2000 |
| JP | 02215173 | 8/1990 |
| WO | WO02/078102 | 10/2002 |

OTHER PUBLICATIONS

Wolf, Silicon Processing for the VLSI Era, vol. 1, p. 535.*
Wolf, S., Tauber R.N.; Silicon Processing for the VLSI Era vol. 1: Process Technology, Lattice Press, Sunset Beach, CA, 1986, p. 535.*

* cited by examiner

Primary Examiner—Alexander Ghyka

(57) ABSTRACT

A process of fabricating a molecular electronic device that preserves the integrity of the active molecular layer of the electronic device during processing is described. In one aspect, a passivation layer is provided to protect a molecular layer from degradation during patterning of the top wire layer. A molecular electronic device structure and a memory system that are formed from this fabrication process are described.

24 Claims, 5 Drawing Sheets

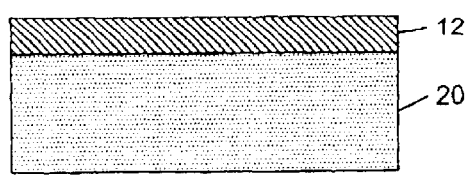
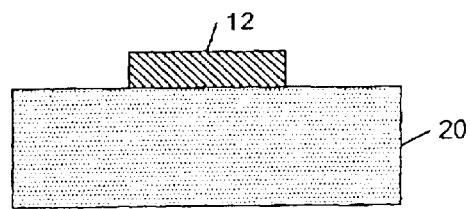
FIG. 3A　　　　　　　　　FIG. 3B
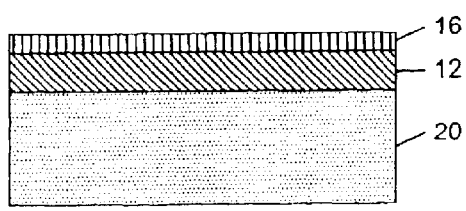
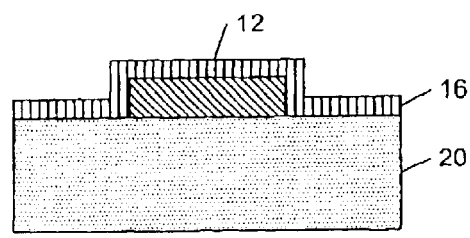
FIG. 4A　　　　　　　　　FIG. 4B

PASSIVATION LAYER FOR MOLECULAR ELECTRONIC DEVICE FABRICATION

CROSS-REFERENCE TO RELATED APPLICATIONS

This application is related to U.S. application Ser. No. 09/282,048, filed on Mar. 29, 1999, by James R. Heath et al., and entitled "Chemically Synthesized and Assembled Electronic Devices," and division of U.S. application Ser. No. 09/815,922, filed on Mar. 22, 2001 now U.S. Pat. No. 6,707,063, by Yong Chen, and entitled "Fabricating A Molecular Electronic Device Having A Protective Barrier Layer," both of which are incorporated herein by reference.

TECHNICAL FIELD

This invention relates to systems and methods for fabricating molecular electronic devices.

BACKGROUND

Many different molecular electronic logic and memory devices have been proposed.

For example, in one molecular electronic device structure, a molecular layer (e.g., a Langmuir-Blodgett film) is sandwiched between a pair of electrically conducting layers (e.g., a pair of metal layers, a metal layer and a doped semiconductor layer, or a pair of doped semiconductor layers). The molecular layer serves as a thin insulating film that may be used in a metal-insulator-metal (MIM) structure that may be configured as a tunnel junction device or a switching device, or a metal-insulator-semiconductor (MIS) structure that may be configured as a logic device or an electroluminescent device.

U.S. Pat. No. 6,128,214 describes another molecular electronic device structure that is configured as a molecular wire crossbar memory (MWCM) system formed from a two-dimensional array of nanometer-scale devices. Each MWCM device is formed at the crossing point (or junction) of a pair of crossed wires where at least one molecular connector species operates as a bi-stable molecular switch between the pair of crossed wires. The resulting device structure may be configured as a resistor, a diode or an asymmetric non-linear resistor. The state of each MWCM device may be altered by applying a relatively high, but non-destructive state-changing voltage and may be sensed with a non-state-changing voltage.

Still other molecular electronic devices have been proposed.

SUMMARY

The invention features a novel process of fabricating a molecular electronic device that preserves the integrity of the active molecular layer of the electronic device during processing. In addition, the invention features a novel molecular electronic device structure and a novel memory system that are formed with this fabrication process.

In one aspect, the invention features a method of fabricating a molecular electronic device having a molecular layer disposed between a bottom wire layer and a top wire layer. In accordance with this inventive method a passivation layer is provided to protect the molecular layer from degradation during patterning of a top wire layer.

Embodiments of the invention may include one or more of the following features.

A selected region of the passivation layer preferably is etched away. A selected region of the passivation layer preferably may be converted from an electrical conductor to an electrical resistor or from an electrical insulator to an electrical conductor.

In one embodiment, an isolation passivation region surrounding the molecular electronic device is converted from an electrical conductor to an electrical insulator. For example, the passivation layer may be a metal layer and the isolation passivation region may be converted to an electrical insulator by oxidation.

In another embodiment, a device passivation region that is disposed between the top wire layer and the bottom wire layer is converted from an electrical insulator to an electrical conductor. For example, the passivation layer may have an antifuse structure, and the device passivation region may be converted to an electrical conductor by applying an electric voltage across the device passivation region.

In one embodiment, the selected passivation region is converted to define the top wire layer. In this embodiment, an unconverted passivation region corresponds to the top wire layer.

In some embodiments, a patterned top wire layer is disposed over the passivation layer. The top wire layer may be patterned by disposing a lift-off layer over the passivation layer, disposing an electrically conductive layer over the lift-off layer, and dissolving the lift-off layer.

In another aspect, the invention features a molecular electronic device that includes a bottom wire layer, a molecular layer disposed over the bottom wire layer in a device region, and a passivation layer. The passivation layer is disposed over the molecular layer and has an electrical conductor region and an electrical insulator region.

In another aspect, the invention features a molecular memory system that includes an array of the above-described molecular electronic devices.

Other features and advantages of the invention will become apparent from the following description, including the drawings and the claims.

DESCRIPTION OF DRAWINGS

FIGS. 3A and 3B are orthogonal diagrammatic cross-sectional side views of a patterned bottom wire layer disposed over a substrate.

FIGS. 4A and 4B are orthogonal diagrammatic cross-sectional side views of a molecular layer that is disposed over the patterned bottom wire layer of FIGS. 3A and 3B.

DETAILED DESCRIPTION

In the following description, like reference numbers are used to identify like elements. Furthermore, the drawings are intended to illustrate major features of exemplary embodiments in a diagrammatic manner. The drawings are not intended to depict every feature of actual embodiments nor relative dimensions of the depicted elements, and are not drawn to scale.

Figure 1:
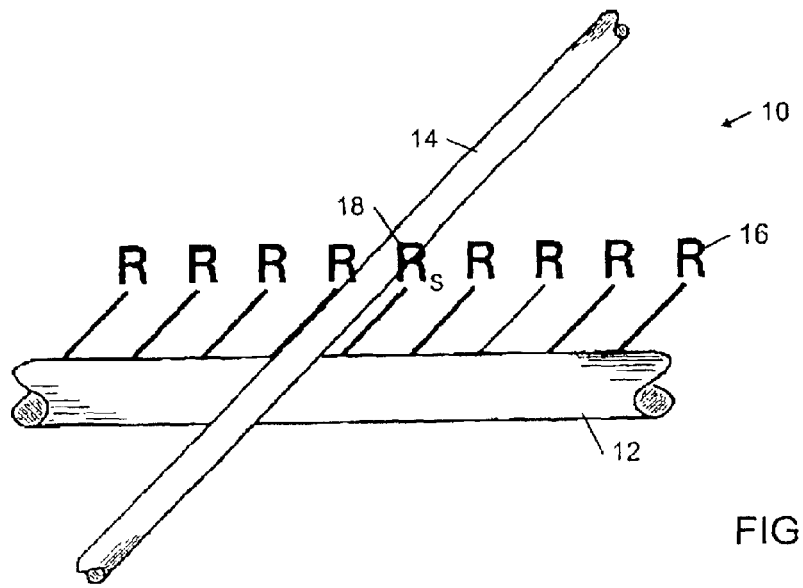
FIG. 1 is a diagrammatic perspective representation of a molecular electronic device formed from at least one electrically addressable molecular species that is sandwiched between two crossed electrically conductive wires.

Referring to FIG. 1, in one embodiment, a molecular electronic device 10 includes two electrically conducting wires 12, 14 that are crossed at a non-zero angle. Each wire 12, 14 may be formed from a metal or a doped semiconductor material. A layer of bi-stable molecules or molecular compounds 16 (denoted by the symbol R) is sandwiched between wires 12, 14. The particular molecule or molecules 18 (denoted by the symbol $R_S$) that are located at the intersection (or junction) of wires 12, 14 act as switch molecules and correspond to the active portion of molecular electronic device 10. In operation, the state of molecular electronic device 10 may be changed by applying a relatively high state-changing voltage across wires 12, 14. The magnitude of the state-changing voltage is sufficient to oxidize or reduce switch molecules 18. Switch molecules 18 may include a redox pair of molecular species that cooperate to balance charge such that when one of the molecular species is oxidized (or reduced), the other molecular species is reduced (or oxidized). In operation, in one example, one molecular species may be reduced and the associated molecular species (the other half of the redox pair) may be oxidized. In another example, one molecular species may be reduced and one of the wires 12, 14 may be oxidized. In a third example, one molecular species may be oxidized and one of the wires 12, 14 may be reduced. In a fourth example, one wire may be oxidized and an oxide associated with the other wire may be reduced. In each of these examples, oxidation or reduction affects the tunneling distance or the tunneling barrier height between the two wires, thereby exponentially altering the rate of charge transport across the wire junction. This electronic functionality serves as the basis for operating molecular electronic device 10 as an electrical switch.

Additional details regarding the general features of molecular electronic device 10 may be obtained from U.S. Pat. No. 6,128,214, which is incorporated herein by reference.

As mentioned above, molecular electronic device 10 may be fabricated in a way that preserves the integrity of the active molecular layer 18. Referring to FIGS. 2–8B, in one embodiment, molecular electronic device 10 may be fabricated as follows.

Figure 2:
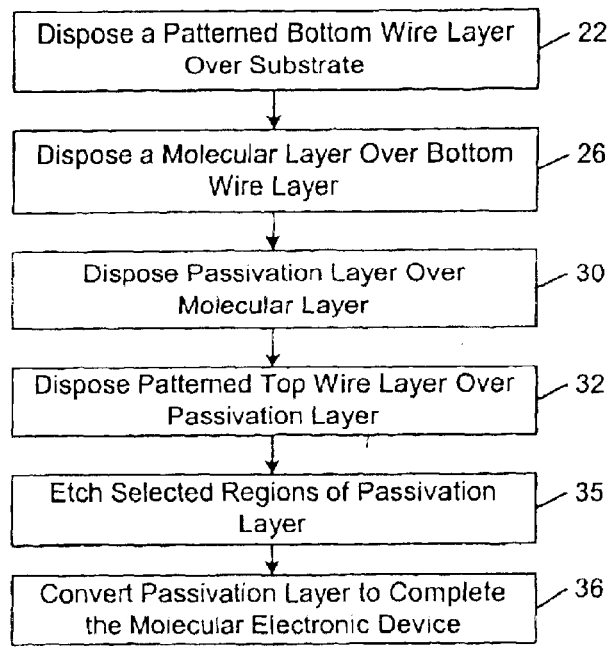
FIG. 2 is a flow diagram of a process of fabricating the molecular electronic device of FIG. 1.

Referring initially to FIGS. 2, 3A and 3B, a patterned bottom wire layer 12 may be disposed over a substrate 20 (step 22). Substrate 20 may be formed from an insulating material, for example, an oxide layer formed on a semiconductor substrate (e.g., a silicon dioxide ($SiO_2$) layer formed on a silicon substrate) or sapphire. Bottom wire layer 12 may be formed from an electrically conducting metal or a doped semiconductor material. For example, in one embodiment, bottom wire layer 12 is formed from an aluminum layer (~0.01–0.1 $\mu$m thick) with a top aluminum oxide coating (~1–2 nm thick). Bottom layer 12 may be deposited onto substrate 20 by a conventional thin film deposition process, including a physical film deposition process (e.g., magnetron sputtering or electron beam deposition) or a chemical film deposition process (e.g., chemical vapor deposition). After patterning (e.g., by lithography), bottom wire layer 12 may have a width dimension ranging from about 1 nm to several microns.

Referring to FIGS. 4A and 4B, a molecular layer 16 is disposed over bottom wire layer 12 (step 26; FIG. 2). Molecular layer 16 may be formed from a variety of different bi-stable molecular species (e.g., one or more of the rotaxane molecules described in U.S. application Ser. No. 09/282,048, filed on Mar. 29, 1999, which is incorporated herein by reference). In some embodiments, the selected molecular species may be dissolved in a solvent (e.g., tetrahydrofuran), prepared as a Langmuir monolayer, and transferred as a Langmuir-Blodgett single molecular monolayer film 16 over bottom wire layer 12. The resulting molecular layer may have a surface coverage of 0.1–100 $nm^2$/molecule with a thickness of about 5 Å to about 100 Å. In other embodiments, a suitable molecular species may be deposited directly onto substrate 20.

Figure 5A:
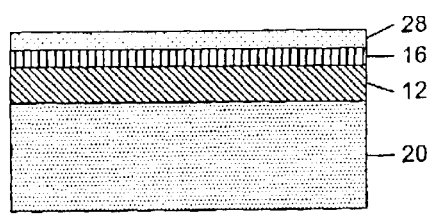
FIGS. 5A and 5B are orthogonal diagrammatic cross-sectional side views of a passivation layer that is disposed over the molecular layer of FIGS. 4A and 4B.
Figure 5B:
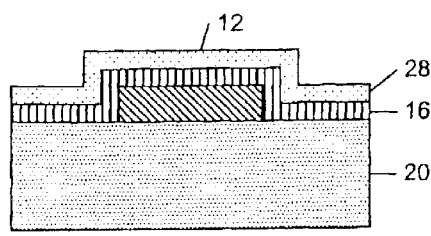

As shown in FIGS. 5A–5B, a passivation layer 28 is disposed over molecular layer 16 (step 30; FIG. 2). The solubility characteristics of passivation layer 28 are selected to protect molecular layer 16 from degradation during the subsequent patterning of top wire layer 14. In particular, passivation layer 28 is selected to be substantially stable in the process that is used to pattern top wire layer 14. Passivation layer 28 may be formed from an electrical conductor (e.g., a metal, such as aluminum or titanium) or an electrical insulator (e.g., an electrical antifuse structure). Antifuses are well known in the art of integrated circuits (see, e.g., U.S. Pat. No. 5,486,776). An antifuse is a structure that is initially non-conductive, but becomes permanently conductive when a voltage that is greater than a prescribed threshold voltage is applied across the antifuse terminals. Passivation layer 28 preferably has a thickness in the range of 1–100 nm, and more preferably has a thickness in the range of 1–10 nm.

Figure 6A:
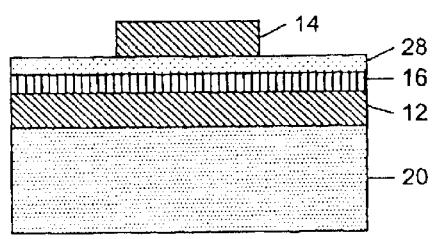
FIGS. 6A and 6B are orthogonal diagrammatic cross-sectional side views of a patterned top wire layer that is disposed over the passivation layer of FIGS. 5A and 5B.
Figure 6B:
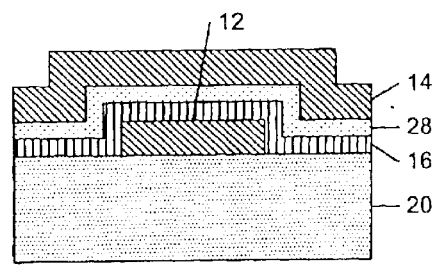

Referring to FIGS. 6A and 6B, an electrically conducting top wire layer 14 is disposed over the passivation layer 28 (step 32; FIG. 2). Top wire layer 14 may be formed from an electrically conducting metal or a doped semiconductor material. For example, in one embodiment, top wire layer 14 is formed from a titanium layer (~5 nm thick) and a top aluminum layer (~0.01–0.1 $\mu$m thick). Top wire layer 14 may be deposited by a conventional thin film deposition process, including a physical film deposition process (e.g., magnetron sputtering or electron beam deposition) or a chemical film deposition process (e.g., chemical vapor deposition). Top wire layer 14 may be patterned by disposing a patterned lift-off layer over the passivation layer, disposing an electrically conductive layer over the lift-off layer, and dissolving the lift-off layer with a solvent with respect to which passivation layer 28 is substantially insoluble. The lift-off layer may be formed from a polymer (e.g., PMMA (poly-methyl methacrylate) and patterned by electron beam lithography or imprinting lithography. Alternatively, the lift-off layer may be formed from a conventional photoresist and patterned by conventional lithographic techniques (e.g., optical lithography). The resulting top wire layer 14 may have a width dimension ranging from about 1 nm to several microns. Because passivation layer 28 completely covers molecular layer 16 and is substantially insoluble in the lift-off solvent, passivation layer 28 seals and protects molecular layer 16 against intrusion of the lift-off solvent, an intrusion which otherwise would degrade or completely destroy molecular layer 16.

Figure 7A:
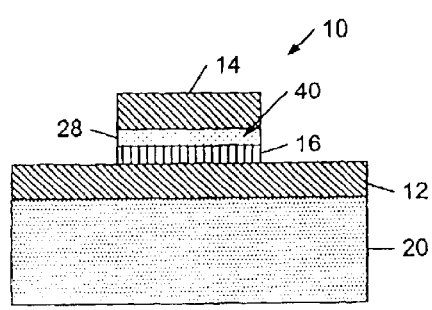
FIGS. 7A and 7B are orthogonal diagrammatic cross-sectional side views of the layered structure of FIGS. 6A and 6B in which selected regions of the passivation layer and the molecular layer are etched away.
Figure 7B:
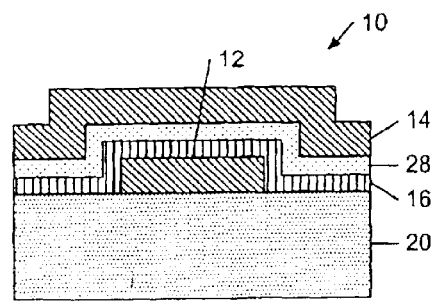

As shown in FIGS. 7A and 7B, electrically conductive wire 14 may be isolated from other devices by etching away selected regions of passivation layer 28 (e.g., by reactive ion etching) (step 35; FIG. 2). In particular, in embodiments where passivation layer 28 is formed from an electrical conductor, regions surrounding top wire layer 14 may be etched away to isolate the molecular electronic device from other devices.

Figure 8A:
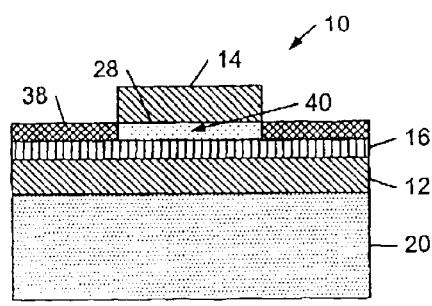
FIGS. 8A and 8B are orthogonal diagrammatic cross-sectional side views of the layered structure of FIGS. 7A and 7B with regions of the passivation layer converted from one electrical conductivity type to another to complete the molecular electronic device.
Figure 8B:
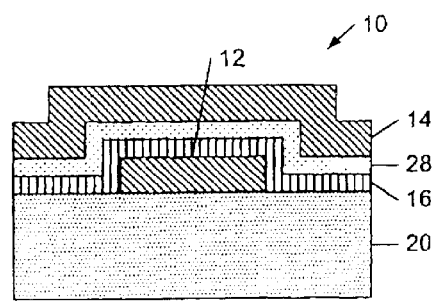

As shown in FIGS. 8A and 8B, in some embodiments, one or more selected regions of passivation layer 28 may be converted from one electrical conductivity type to another to complete the molecular electronic device (step 36; FIG. 2). For example, in embodiments where passivation layer 28 is formed from an electrical conductor, an isolation passivation region 38 is converted to an electrical insulator to further isolate the molecular electronic device 10 from other devices. For example, if passivation layer 28 is formed from a metal (e.g., a metal, such as aluminum or titanium), isolation passivation region 38 may be converted to a metal oxide electrical insulator by a conventional oxidation process. In another embodiment, passivation layer 28 may be formed from an electrical insulator and a device passivation region 40—which is disposed between top wire layer 14 and bottom wire layer 12—is converted to an electrical conductor to complete the device region of the molecular electronic device. For example, if passivation layer 28 is formed from an electrically insulating antifuse structure, device passivation region 40 may be converted to an electrical conductor by applying across top wire layer 14 and bottom wire layer 16 a voltage that is sufficient to blow the antifuse structure. The threshold current needed to blow the antifuse structure is within the electrical current tolerance of molecular layer 16. In another illustrative example, passivation layer 28 may be formed from an oxide (e.g., a metal oxide or a semiconductor oxide), and device passivation region 40 may be converted to an electrical conductor by metal diffusion of top wire layer 14 into device passivation region 40. In this exemplary embodiment, a suitable ohmic contact formation process may be used to convert device passivation region 40 into an electrical conductor.

The resulting molecular electronic device 10 may have lateral dimensions on the order of 50 Å to 10 μm.

Figure 9A:
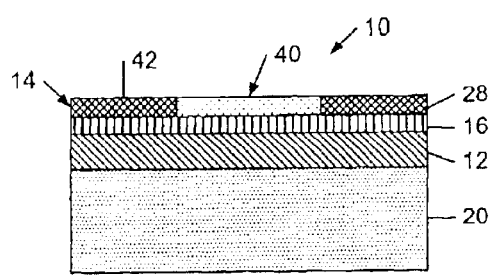
FIGS. 9A and 9B are orthogonal diagrammatic cross-sectional side views of an alternative molecular electronic device structure in which regions of a passivation layer are converted from one electrical conductivity type to another to form a top wire layer of a molecular electronic device.
Figure 9B:
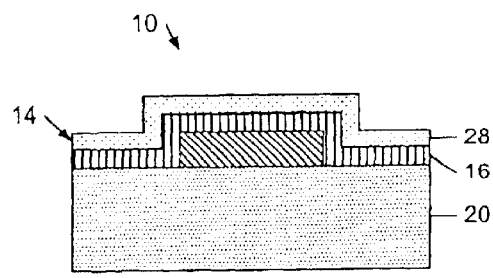

Referring to FIGS. 9A and 9B, in another embodiment, top wire layer 14 is formed from passivation layer 28. In this embodiment, a region of passivation layer 28 is converted from one electrical conductivity type to another to form top wire layer 14. For example, in one embodiment, passivation layer 28 is formed from an electrical conductor (e.g., aluminum or titanium) and isolation passivation region 42 is converted to an electrical insulator by a conventional oxidation process to isolate the molecular electronic device from other devices. In another embodiment, passivation layer 28 is formed from an electrical insulator (e.g., an electrical antifuse structure), in which case a device passivation region 40 is converted to an electrical conductor to complete the device region of the molecular electronic device.

Depending upon the molecules or materials selected for molecular layer 16, molecular electronic device 10 may exhibit any one of a variety of different electrical switching functions that may be used to controllably connect or disconnect bottom wire layer 12 and top wire layer 14. The molecular electronic device may be singly configurable or reconfigurable. In singly configurable embodiments, the initial state of molecular electronic device 10 may be open or closed. By electrically biasing molecular electronic device 10 beyond a particular threshold voltage, the active material or molecules 18 may be oxidized or reduced to permanently reverse the initial state of the device and, thereby, irreversibly close or open the switching state of the device. In reconfigurable embodiments, the switching device may be opened and closed multiple times by cycling the polarity and the magnitude of the applied voltage beyond appropriate threshold values that are selected to reversibly oxidize and reduce the active material or molecules 18.

In general, the type of electrical connection formed between bottom wire layer 12 and top wire layer 14 depends upon the materials from which wire layers 12, 14 and molecular layer 16 are formed. Table 1 identifies the various types of electrical switching functions that may be obtained from different device material combinations.

TABLE 1

| | Wire Layer Materials | | | | |
|---|---|---|---|---|---|
| Device Type | Metal-Metal (same) | Metal-Metal (different) | Metal-Semiconductor | Semiconductor-Semiconductor (pn junction) | Semiconductor-Semiconductor (heterojunction) |
| Resistor | X | X | X | | |
| Tunneling Resistor | X | X | X | | |
| Resonant Tunneling Resistor | X | X | X | | |
| Diode | | X | X | X | X |
| Tunneling Diode | | X | X | X | |
| Resonant Tunneling Diode | | X | X | X | X |
| Battery | | X | X | | X |

Figure 10:
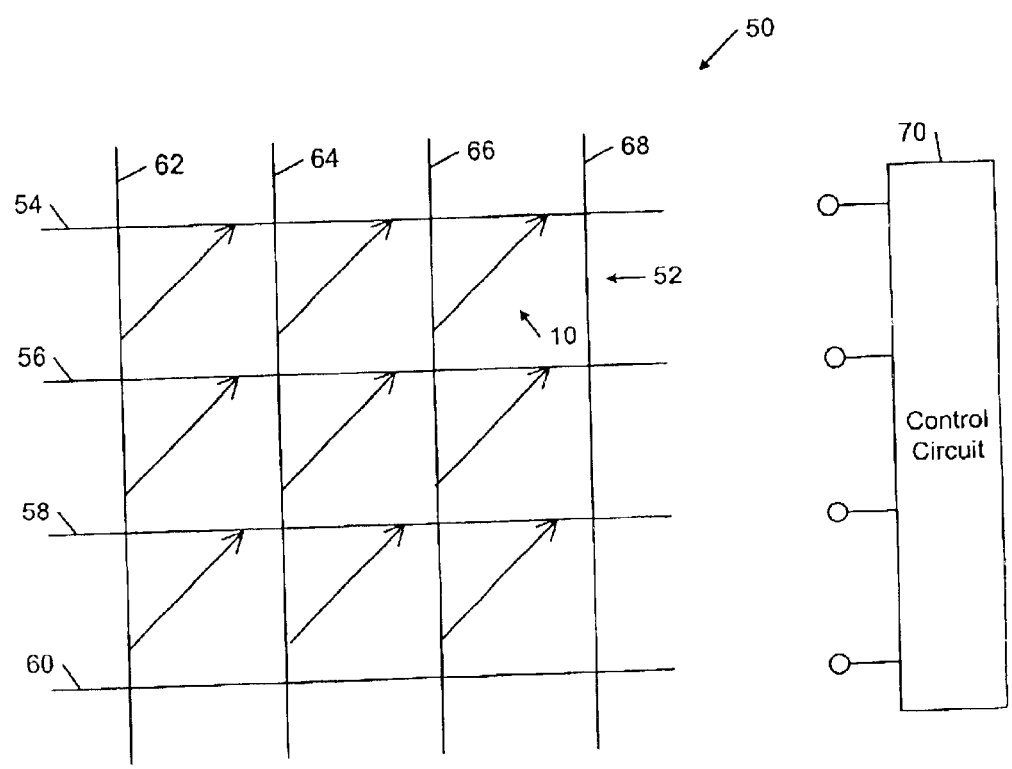
FIG. 10 is a circuit diagram of a resistive crossbar memory structure that includes an array of molecular electronic devices.

Referring to FIG. 10, in one embodiment, molecular electronic device 10 may be incorporated into a resistive molecular wire crossbar memory 50 that includes a plurality of memory cells 52 that are arranged in multiple rows and multiple columns. Each memory cell 52 includes a molecular electronic device 10 that is coupled between a respective bottom wire line 54, 56, 58, 60 and a respective top wire line 62, 64, 66, 68. The voltage across a memory cell is determined by the voltages applied to the bottom wire line and the top wire line between which the memory cell is coupled. A control circuit 70 is configured to address (or select), program information into, and read information from one or more memory cells 52 within memory cell array 50. Molecular electronic devices 10 are activated by electrochemical reduction or oxidation of the molecules 18 that are sandwiched between the bottom and top wire lines. In this embodiment, the molecules of molecular layer 16 are selected to have a large hysteresis in the voltammogram so that a switch may be oxidized at a relatively high voltage and its status may be read at a lower voltage. When a switch is (electrochemically) closed, the resistance between connecting wires is low, which may correspond to a logic level of "1". When the switch is opened, the resistance is high, which may correspond to a logic level of "0". Further details regarding the operation of a resistive molecular crossbar memory may be obtained from U.S. Pat. No. 6,128,214.

Other embodiments are within the scope of the claims.

For example, in addition to a resistive molecular wire crossbar memory, other molecular wire crossbar memory embodiments may include an array of molecular electronic devices that are configured to provide any one of the other switching functions identified in Table 1. In addition, the above-described molecular electronic devices may be implemented in a circuit designed to perform one or more logic (as opposed to memory) functions.

Still other embodiments are within the scope of the claims.

What is claimed is:

1. A method of fabricating a molecular electronic device having an organic molecular layer disposed between a bottom wire layer and a top wire layer, comprising:
   providing a passivation layer to protect the organic molecular layer from degradation during patterning of a top wire layer.

2. A method of fabricating a molecular electronic device having a molecular layer disposed between a bottom wire layer and a top wire layer, comprising:
   providing a passivation layer to protect the molecular layer from degradation during patterning of a top wire layer; and
   converting a selected region of the passivation layer from an electrical conductor to an electrical resistor or from electrical insulator to an electrical conductor.

3. The method of claim 2, wherein an isolation passivation region surrounding the molecular electronic device is converted from an electrical conductor to an electrical insulator.

4. The method of claim 3, wherein the passivation layer is a metal layer and the isolation passivation region is converted to an electrical insulator by oxidation.

5. The method of claim 2, wherein a device passivation region disposed between the top wire layer and the bottom wire layer is converted from an electrical insulator to an electrical conductor.

6. The method of claim 5, wherein the device passivaton region is converted to an electrical conductor by applying an electric voltage across the device passivation region.

7. The method of claim 6, wherein the passivation layer has an antifuse structure.

8. The method of claim 2, wherein the selected passivation region is converted to define the top wire layer.

9. The method of claim 8, wherein an unconverted passivation region corresponds to the top wire layer.

10. The method of claim 1, further comprising disposing a patterned top wire layer over the passivation layer.

11. The method of claim 10, wherein the top wire layer is patterned by disposing a lift-off layer over the passivation layer, disposing an electrically conductive layer over the lift-off layer, and dissolving the lift-off layer.

12. The method of claim 1, further comprising:
   forming a bottom electrically conducting wire structure;
   forming on the bottom wire structure in a device region an organic molecular layer comprising a bi-stable molecular species; and
   wherein providing the passivation layer comprises forming a passivation structure on the organic molecular layer.

13. The method of claim 12, wherein the formed passivation structure is electrically conducting in a regions over the device region and electrically insulating in regions surrounding the device region.

14. The method of claim 13, wherein the electrically insulating region and the electrically conducting region are formed from a common material structure and one of the electrically insulating region and the electrically conduting region corresponds to a converted region of the common material structure.

15. The method of claim 13, wherein the electrically conducting region of the passivation structure is formed of an electrically conducting material and the electrically insulating region of the passivation structure corresponds to an oxidized region of the electrically conducting material.

16. The method of claim 13, wherein the electrically conducting region of the passivation structure corresponds to a metal layer and the electrically insulating region of the passivation structure corresponds to an oxidized region of the metal layer.

17. The method of claim 13, wherein the electrically insulating region of the passivation structure has an antifuse structure and the electrically conducting region of the passivation structure has a blown antifuse structure.

18. The method of claim 13, wherein the electrically conducting region of the passivation structure corresponds to a top wire layer.

19. The method of claim 12, further comprising forming a patterned top electrically conducting wire layer on the passivation structure in a region over the device region.

20. The method of claim 1, further comprising:
   forming a bottom wire layer; and
   forming an organic molecular layer over the bottom wire layer.

21. The method of claim 20, wherein the molecular layer comprises switch molecules.

22. A method of fabricating a molecular electronic device having a molecular layer disposed between a bottom wire layer and a top wire layer, comprising:
   forming a bottom wire layer; and
   forming an organic molecular layer over the bottom wire layer wherein the molecular layer comprises rotaxane molecules; and
   providing a passivation layer to protect the molecular layer from degradation during patterning of a top wire layer.

23. The method of claim 20, wherein the molecular layer has a thickness of about 0.5 nm to about 10 nm.

24. The method of claim 20, wherein the molecular layer has a surface coverage of 0.1–100 $nm^2$/molecule.

* * * * *